United States Patent
Lake

(10) Patent No.: US 6,309,954 B1
(45) Date of Patent: *Oct. 30, 2001

(54) METHODS OF FORMING FLIP CHIP BUMPS AND RELATED FLIP CHIP BUMP CONSTRUCTIONS

(75) Inventor: Rickie C. Lake, Eagle, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/515,271

(22) Filed: Feb. 29, 2000

Related U.S. Application Data

(63) Continuation of application No. 08/931,814, filed on Sep. 16, 1997, now Pat. No. 6,083,773.

(51) Int. Cl.$^7$ .................................................. H01L 21/44
(52) U.S. Cl. ........................... 438/613; 438/613; 438/106; 438/107; 438/108; 438/666; 258/678; 258/687
(58) Field of Search .................................... 438/106–108, 438/613, 597–600, 666; 258/678–687

(56) References Cited

U.S. PATENT DOCUMENTS

| | | |
|---|---|---|
| 2,934,685 | 4/1960 | Jones . |
| 4,600,600 | 7/1986 | Pammer et al. . |
| 5,022,580 | 6/1991 | Pedder . |
| 5,290,732 * | 3/1994 | Kumar et al. .......................... 437/183 |
| 5,541,135 | 7/1996 | Pfeifer et al. . |
| 5,583,073 * | 12/1996 | Lin et al. ............................... 439/183 |
| 5,655,703 | 8/1997 | Jimarez et al. . |
| 5,760,469 | 6/1998 | Higashiguchi et al. . |
| 5,795,619 * | 8/1998 | Lin et al. ............................... 427/123 |
| 5,796,591 | 8/1998 | Dalal et al. . |
| 5,828,128 | 10/1998 | Higashiguchi et al. . |
| 5,923,955 * | 7/1999 | Wong .................................... 438/108 |
| 6,083,773 * | 7/2000 | Lake ..................................... 438/108 |

FOREIGN PATENT DOCUMENTS 4-266037   9/1992 (JP) .

OTHER PUBLICATIONS

Ken Gilleo, Flip or Flop?, *Technical Articles of Alpha Metals, Inc.,* Dec. 1996, 10 pages.

Ken Gilleo, Flip Chip 1, 2, 3: Bump, Bond, Fill, *Technical Articles of Alpha Metals, Inc.,* Jul. 1996, 6 pages.

*IBM technical Disclosure Bulletin,* Encapsulated Solder Joint for Chip Mounting, vol. 32, No. 10B, Mar. 1990, 1 page.

Ingraham et al. "Flip–chip soldering to bare copper circuits" IEEE 0569–5503/90/0000–0333 pp. 333–337.*

* cited by examiner

*Primary Examiner*—Matthew Smith
*Assistant Examiner*—Granvill D Lee, Jr.
(74) *Attorney, Agent, or Firm*—Wells, St. John, Roberts, Gregory & Matkin PS

(57) ABSTRACT

Methods of forming flip chip bumps and related flip chip bump constructions are described. In one implementation, a bump of conductive material is formed over a substrate. At least a portion of the bump is dipped into a volume of conductive flowable material, with some of the flowable material remaining over the bump. The remaining flowable material over the bump is solidified and includes an outermost surface the entirety of which is outwardly exposed. In another implementation, the outermost surface include an uppermost generally planar surface away from the substrate. The solidified flowable material together with the conductive material of the bump provide a bump assembly having a height which is greater than the height of the original bump. The increased height is achieved without meaningfully increasing a width dimension of the bump proximate the substrate.

52 Claims, 6 Drawing Sheets

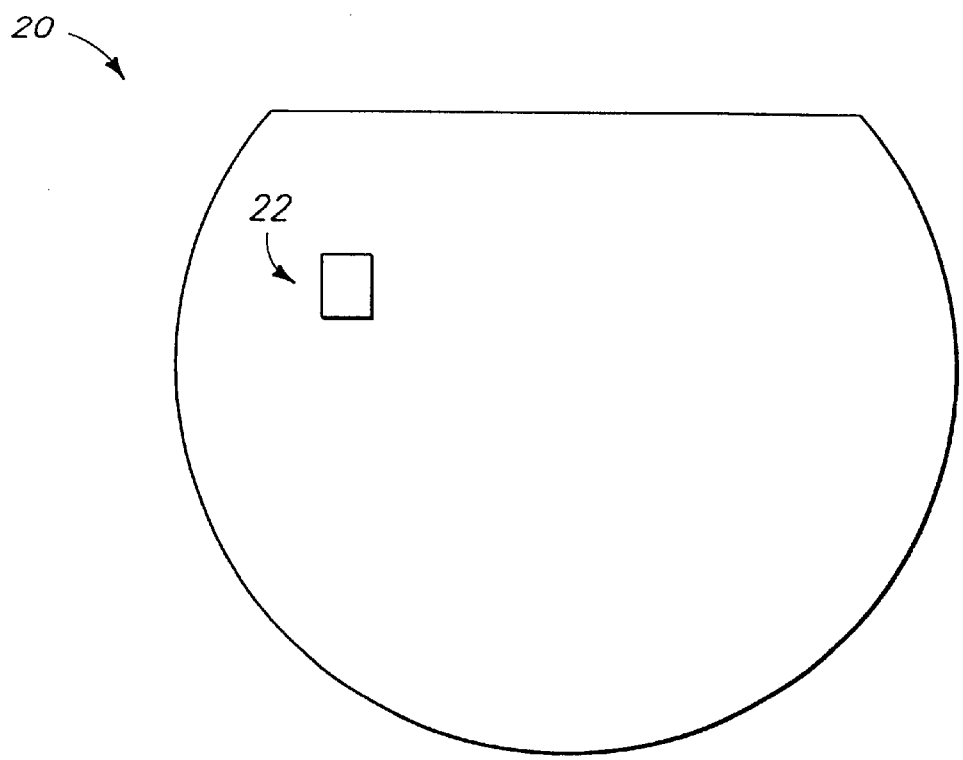
_FIG. 1_
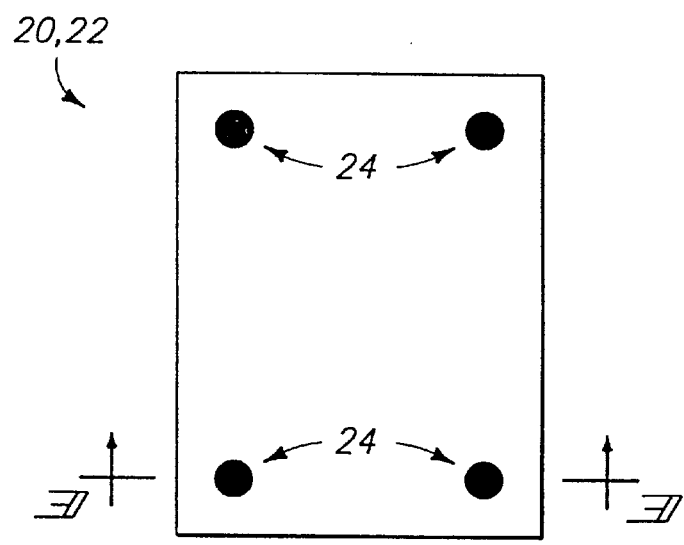
_FIG. 2_

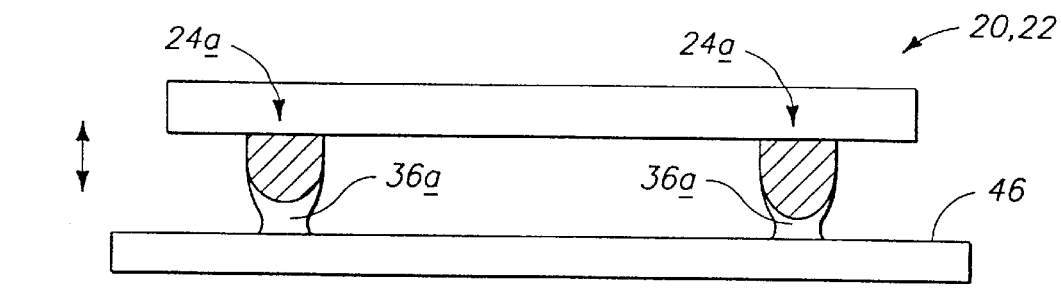
F I G. 13
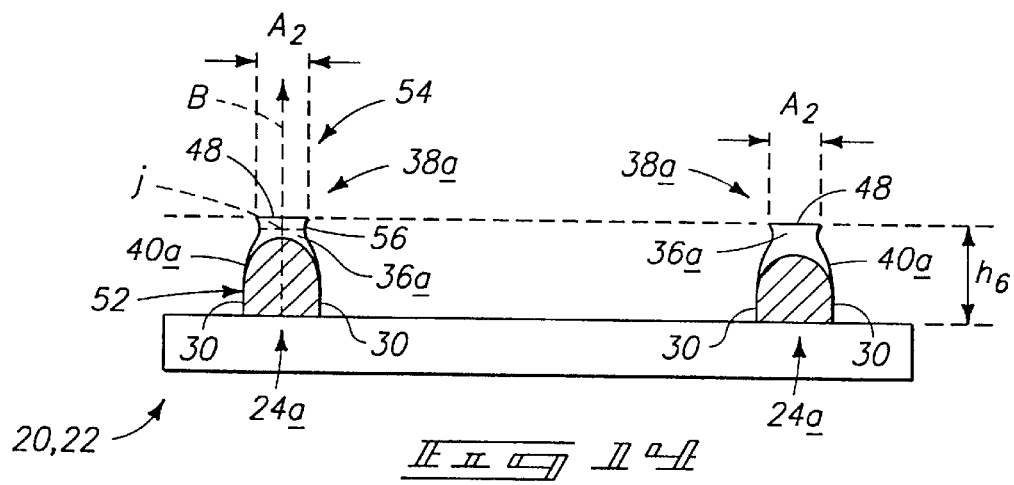
F I G. 14
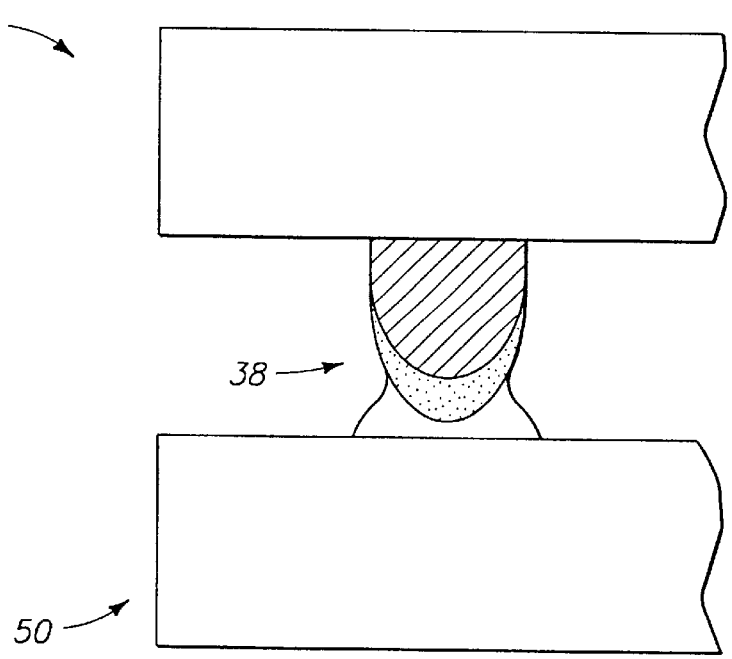
F I G. 15

US 6,309,954 B1

METHODS OF FORMING FLIP CHIP BUMPS AND RELATED FLIP CHIP BUMP CONSTRUCTIONS

CROSS REFERENCE TO RELATED APPLICATION

This is a Continuation of U.S. patent application Ser. No. 08/931,814, filed Sep. 16, 1997, and titled "Methods of Forming Flip Chip Bumps and Related Flip Chip Bump Constructions", now U.S. Pat. No. 6,083,773.

TECHNICAL FIELD

This application pertains to methods of forming flip chip bumps and to related flip chip bump constructions.

BACKGROUND OF THE INVENTION

One method of integrated circuit interconnection is called flip chip bonding. Here, bumps of solder or other conductive material are deposited onto conductive pads of a semiconductor wafer or chip. After separation of individual dies from the wafer, the individual dies or chips are turned upside down, and the bumps are properly aligned with a metallization pattern on another substrate. The aligned bumps are then joined to appropriate points on the pattern.

This invention arose out of concerns associated with improving flip chip bump constructions and formation techniques. This invention also arose out of concerns associated with improving circuit interconnections which utilize flip chip bumps and the methods through which such interconnections are formed.

SUMMARY OF THE INVENTION

Methods of forming flip chip bumps and related flip chip bump constructions are described. In one implementation, a bump of conductive material is formed over a substrate. At least a portion of the bump is dipped into a volume of conductive flowable material, with some of the flowable material remaining over the bump. The remaining flowable material over the bump is solidified and includes an outermost surface the entirety of which is outwardly exposed. In another implementation, the outermost surface include an uppermost generally planar surface away from the substrate. The solidified flowable material together with the conductive material of the bump provide a bump assembly having a height which is greater than the height of the original bump. The increased height is achieved without meaningfully increasing a width dimension of the bump proximate the substrate.

BRIEF DESCRIPTION OF THE DRAWINGS

Preferred embodiments of the invention are described below with reference to the following accompanying drawings.

FIG. 1 is a top plan view of a semiconductor wafer.

FIG. 2 is a view of an individual die which comprises part of the FIG. 1 wafer.

FIG. 13 is a view of the FIG. 11 wafer portion at a different processing step.

FIG. 14 is a view of the FIG. 11 wafer portion at a different processing step.

FIG. 15 is a view of a pair of substrates which have been bonded together.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 3:
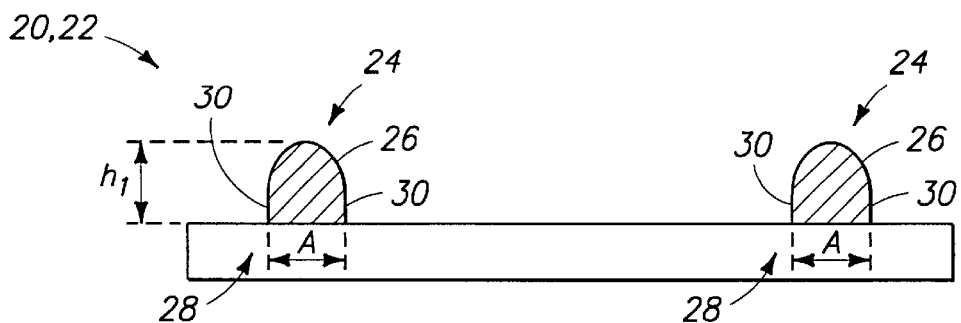
FIG. 3 is a view taken along line 3—3 in FIG. 2.

Referring to FIGS. 1–3, a semiconductor wafer or substrate in process is shown generally at 20. Substrate 20 has been fabricated into discrete die or die areas. An exemplary die or die area is shown at 22. The die areas have integrated circuitry fabricated therewithin and will be singulated into individual die constituting flip chips.

A plurality of bumps 24 of conductive material are formed over substrate 20. For purposes of the ongoing discussion, substrate 20 and/or individual die 22 are considered as a first substrate. The illustrated bumps 24 constitute a portion of a series of bumps which are formed over substrate 20 and make desired contact with bond pads which are not specifically shown. The bond pads enable electrical connections to be made between the resultant chip and circuitry or components external of the chip. Individual bumps of the series have an outer surface 26 which defines a height $h_f$ over the substrate. Individual bump heights can vary between the bumps as will become apparent below. Additionally, bumps can come in a range of heights. An exemplary range can be between about 1.5 to 4.5 mils. Other range values are possible. Bumps 26 also include base portions 28 which are disposed over substrate 22. The base portions define respective first surface areas A which engage substrate 22. First surface areas A define respective width dimensions of each bump which lie in directions in the plane of the page upon which FIG. 3 appears. Typical width dimensions are between about 8–10 mils. Other width dimensions are possible such as width dimensions between about 4–5 mils. The width dimensions are bounded by the outer surface of base portions 28 designated at 30 proximate substrate 22.

Figure 4:
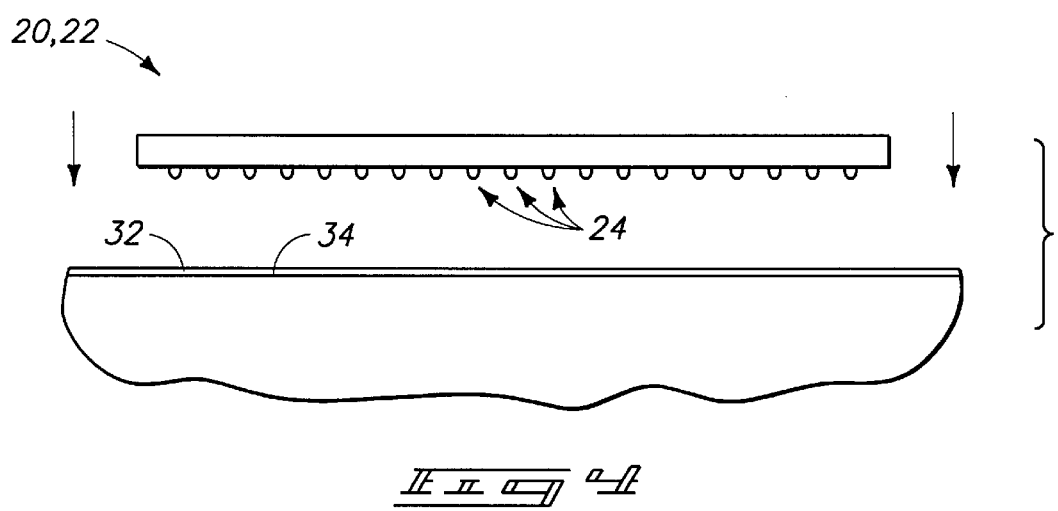
FIG. 4 is a view of the FIG. 1 wafer undergoing processing in accordance with one implementation of the invention.
Figure 5:
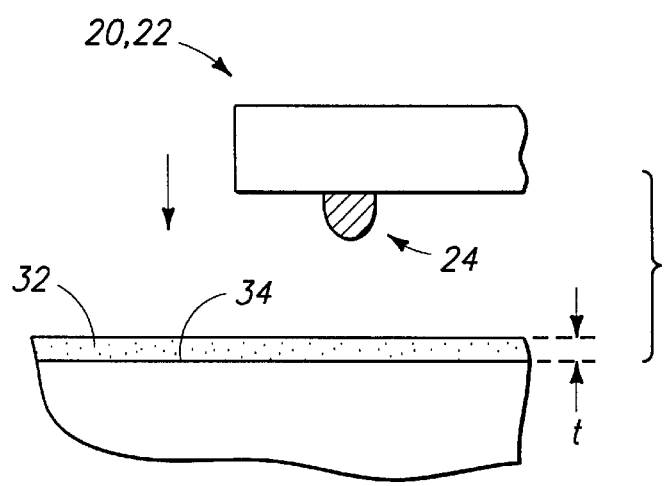
FIG. 5 is a fragmentary portion of the FIG. 4 wafer.

Referring to FIGS. 4 and 5, a volume of conductive flowable material 32 is provided over a surface 34 to a desired thickness t. Substrate 20 is shown in an inverted position with bumps 24 facing flowable material 32. An exemplary thickness t is between about two-thirds to three-fourths of bump heights $h_1$. In the illustrated example, flowable material 32 comprises a conductive epoxy which is drawn down over surface 34; and surface 34 constitutes a generally smooth planar surface such as glass or machined and polished metal.

Figure 6:
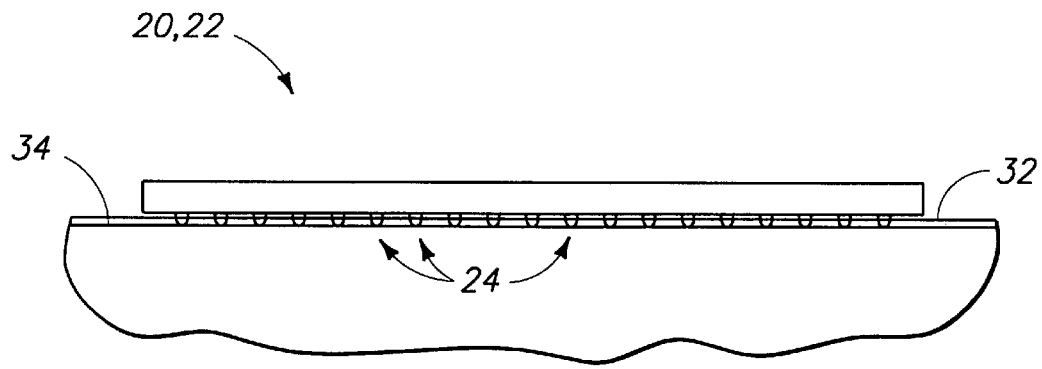
FIG. 6 is a view of the FIG. 1 wafer at a processing step which is different from the one shown in FIG. 4.
Figure 7:
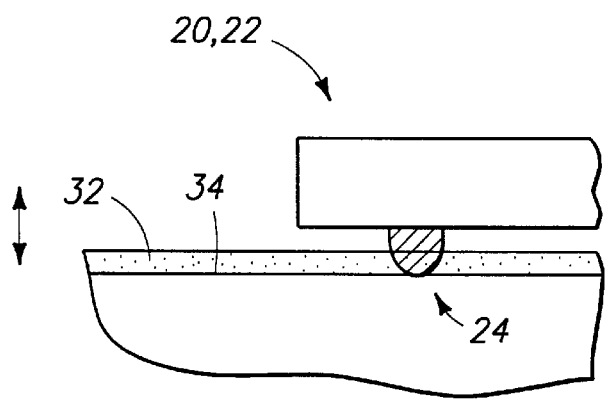
FIG. 7 is a fragmentary portion of the FIG. 6 wafer.

Referring to FIGS. 6 and 7, substrate 20 and surface 34 are moved toward one another sufficiently to immerse at least a portion of bumps 24 in conductive material 32. The bumps are extended into material 32 a distance which is less than the individual bump heights. In some instances, such distance is sufficient to engage a bump with surface 34. In other instances, where the bumps do not have standardized heights, some of the bumps will not be engaged with surface 34.

Figure 8:
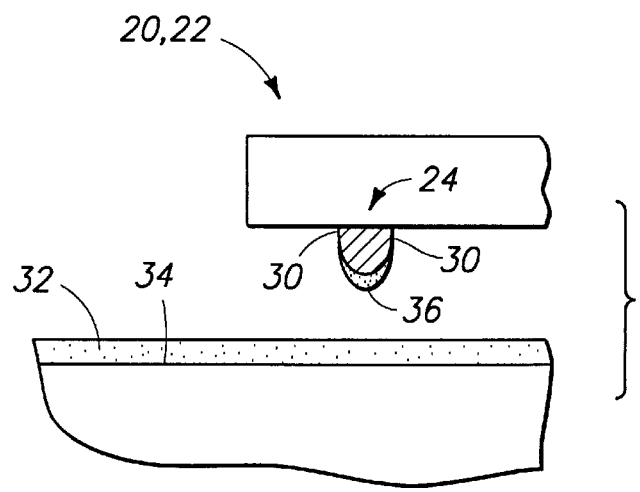
FIG. 8 is a view of the FIG. 7 wafer portion at a different processing step.

Referring to FIG. 8, substrate 20 and material 32 or surface 34 are separated from one another and bumps 24 are removed from material 32. For purposes of the ongoing discussion, the immersing and removing of the bumps into material 34 constitutes dipping the bumps into the flowable material. When the bumps are removed from material 32, at least some flowable material 36 remains over bumps 24 typically in a generally flowable state. In the illustrated example, remaining material 36 is not disposed over base portion outer surface 30. Subsequently, the bumps are exposed to conditions which are effective to at least partially solidify flowable material 36 over the bump. As used in the context of this document, the term "solidify" will be understood to mean imparting a relative firmness to the flowable material. In the illustrated example, material 36 is solidified into a generally non-flowable state. Where material 36 constitutes conductive epoxy, such would be sufficiently cured into the non-flowable state.

Figure 9:
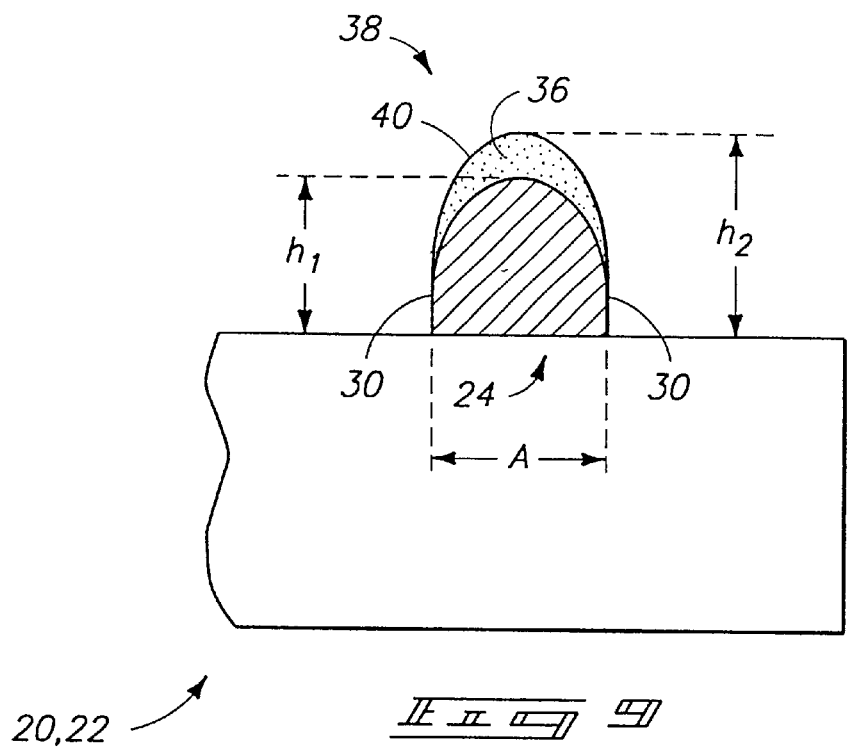
FIG. 9 is an enlarged view of the FIG. 8 wafer portion.

Referring to FIG. 9, solidified material 36 together with original bump 24 provide a bump assembly 38 having a height $h_2$ which is greater than $h_1$. Exemplary heights $h_2$ are greater than or equal to about 5 mils. Bump assembly 38 includes an outermost surface 40 the entirety of which is outwardly exposed. In the illustrated example, bump assembly outermost surface 40 comprises base portion outer surface 30. Accordingly, the addition of solidified material 36 increases the effective bump height without significantly increasing the width dimension. After material 36 is solidified, substrate 20 can be singulated into individual die which can then be bonded with a second substrate 50 (FIG. 15).

Figure 10:
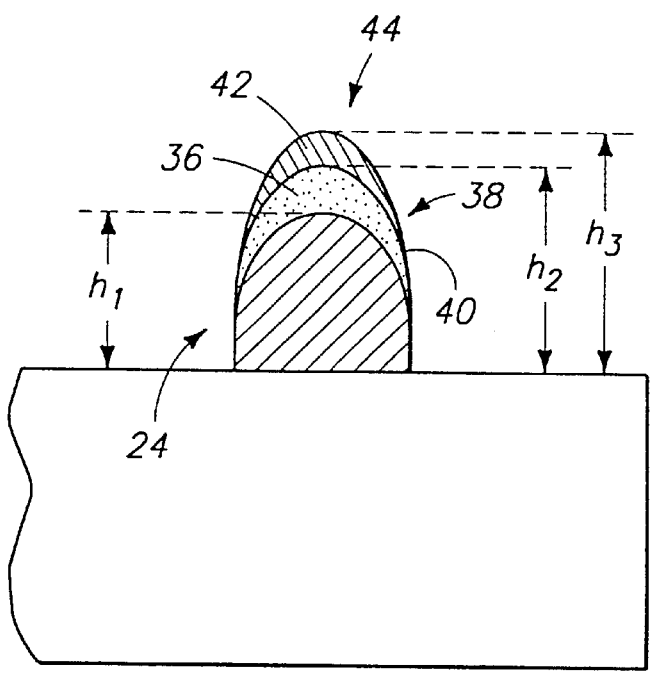
FIG. 10 is a view of the FIG. 9 wafer portion which has been processed in accordance with an alternate embodiment.
Figure 10:
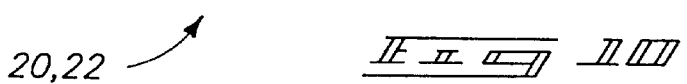

Referring to FIG. 10 and in accordance with one aspect of the invention, after material 36 is solidified to provide bump assembly 38, outermost surface 40 can be dipped into a volume of material such as material 32, substantially as described above. Accordingly, at least some flowable material 42 remains over outermost surface 40. Remaining material 42 can be solidified substantially as described above. Alternately, remaining material 42 can be maintained in a generally flowable state and subsequently bonded with a second substrate as in FIG. 15. If material 42 is solidified, such would provide a composite bump assembly 44 having an increased height $h_3$ which is greater than both $h_1$ and $h_2$. Similarly, the addition of solidified material 42 can increase the effective bump height without significantly increasing the width dimension. The process can be repeated as desired.

Figure 11:
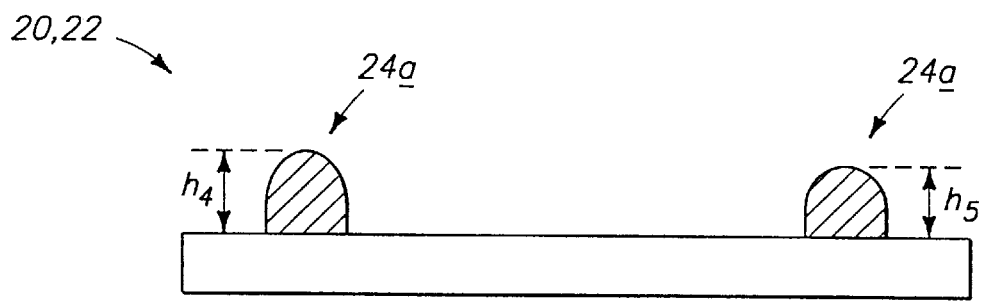
FIG. 11 is a view of a wafer portion having a pair of flip chip bumps which are to be processed in accordance with an alternate implementation of the invention.

Referring to FIG. 11, an alternate embodiment is described with like numerals from the above described embodiment being utilized where appropriate, with differences being indicated by the suffix "a" or with different numerals or letters. Accordingly, bumps 24a are provided over substrate 22. The bumps can have the same or different heights such as $h_4$, $h_5$.

Figure 12:
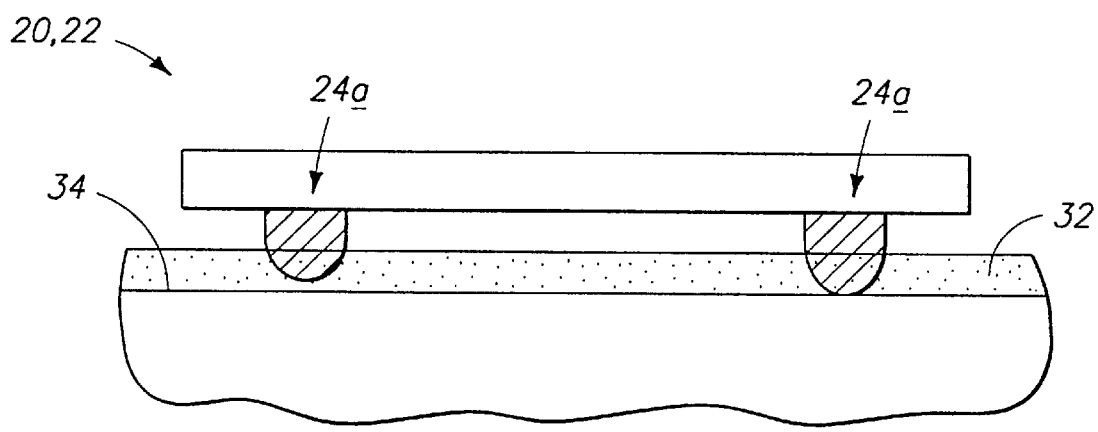
FIG. 12 is a view of the FIG. 11 wafer portion at one processing step.

Referring to FIG. 12, bumps 24a are immersed in flowable material 32. The rightmost bump 24a has a height which is sufficient to bring it into engagement with surface 34. The leftmost bump, however, is not sufficient in height to engage surface 34. Substrate 22 and material 34 are subsequently separated from one another with some conductive material 36a (FIG. 13) remaining over the individual bumps as described above.

Referring to FIG. 13, and while remaining material 36a is in a generally flowable state, such is engaged with and solidified or cured against a generally planar surface 46. Such renders material 36a into a generally non-flowable or solidified state. After material 36a is solidified, substrate 22 and surface 46 are separated from one another.

Referring to FIG. 14, respective bump assemblies 38a are provided. Each bump assembly 38a includes an outermost surface 40a, a portion of which defines a generally planar uppermost surface 48 away from substrate 22. Uppermost surfaces 48 define respective second surface areas $A_2$. The magnitudes of the first and second surface areas can be different from one another, e.g., second surface areas $A_2$ can be less in magnitude than first surface areas A (FIG. 3). In the illustrated example, the first and second surface areas define planes which are generally parallel with one another.

Processing bumps 24a in accordance with this aspect of the invention provides bump assemblies 38a which are essentially uniform in height relative to the substrate over which each is formed.

Alternately considered and with reference to the leftmost bump assembly 38a, a main body portion 52 is disposed over substrate 22 and extends away therefrom along a central axis B. A top portion 54 is joined with main body portion 52 proximate a joinder region j, indicated by a dashed line intermediate uppermost surface 48 and substrate 22. A side surface 56 is joined with uppermost surface 48 and extends away therefrom and toward central axis B. In the illustrated example, main body portion 52 tapers along central axis B away from substrate 22; and top portion 54 approximates a frustum.

The above-described methodologies provide flip chip bumps having greater heights without meaningfully increasing, if at all, the width dimensions thereof. This allows desirable spacing to be maintained between bonded substrates and reduces the likelihood that the epoxy to which the bump is bonded on another substrate undesirably contacts the substrate from which the bumps project.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of preparing a flip chip bump comprising:
   dipping at least a portion of an entirely outwardly exposed conductive bump disposed over a substrate into a volume of conductive flowable material, at least some of the conductive flowable material remaining over the bump; and
   solidifying conductive flowable material remaining over the bump, the solidified conductive material having an outermost surface the entirety of which is outwardly exposed.

2. The method of claim 1, further comprising, after solidifying the conductive flowable material, dipping at least a portion of the outermost surface into a volume of second conductive flowable material, at least some of the second flowable material remaining over the outermost surface.

3. The method of claim 2, further comprising, after dipping the outermost surface portion into the second conductive flowable material, solidifying the second conductive flowable material remaining over the outermost surface, the solidified second conductive flowable material remaining over the outermost surface itself having an outermost surface, an entirety of which is outwardly exposed.

4. The method of claim 1, wherein dipping comprises dipping the bump portion into the conductive flowable material a distance less than a height of the bump over the substrate.

5. The method of claim 4, wherein dipping comprises dipping the bump portion into the conductive flowable material wherein the distance is sufficient to engage the bump with a surface over which the conductive flowable material is provided.

6. The method of claim 4, wherein dipping comprises dipping the bump portion into the conductive flowable material wherein the distance is about two-thirds to three-fourths of the bump height.

7. The method of claim 1, wherein dipping comprises dipping the bump portion into the conductive flowable material wherein the bump includes a base portion having an outer surface proximate the substrate and conductive flowable material remaining over the bump is not disposed over the base portion outer surface.

8. A method of preparing a flip chip bump comprising:
dipping at least a portion of a conductive bump disposed on a substrate into a conductive flowable material, at least some of the flowable material remaining over the bump; and
solidifying conductive flowable material remaining over the bump, an entirety of the bump being outwardly exposed, at least a portion of the outermost surface defining a generally planar uppermost surface away from the substrate.

9. The method of claim 8, wherein solidifying comprises:
engaging conductive flowable material remaining over the bump with a generally planar surface; and
at least partially solidifying the conductive flowable material during engaging.

10. The method of claim 9, wherein:
dipping comprises dipping the at least a portion of the bump into a curable material, and
solidifying comprises curing the curable material.

11. The method of claim 9, wherein dipping comprises dipping the bump wherein the bump defines a first surface area engaging the substrate and the generally planar uppermost surface defines a second surface area, the first and second surface areas being different in magnitude.

12. The method of claim 11, wherein engaging comprises forming the first and second surface areas to define generally parallel planes.

13. The method of claim 11, wherein engaging comprises:
forming the first surface area to define a width dimension in a direction; and
forming the second surface area to define a width dimension in the same direction less than the width dimension of the first surface area.

14. The method of claim 9, wherein dipping comprises dipping at least a portion of the bump, the bump defining a first surface area that engages the substrate, and wherein engaging comprises defining a second surface area, a magnitude of the second surface area being less than the magnitude of the first surface area.

15. A method of preparing a flip chip bump comprising:
dipping at least a portion of a bump comprising conductive material disposed over a substrate into a conductive flowable material, at least some of the conductive flowable material remaining over the bump;
while flowable material remaining over the bump is in a generally flowable state, engaging the flowable material with a generally planar surface;
rendering the flowable material remaining over the bump into a generally non-flowable state; and
separating the substrate from the generally planar surface.

16. The method of claim 15, wherein separating the substrate from the generally planar surface takes place after the flowable material is rendered into the generally non-flowable state.

17. The method of claim 15, wherein at least some rendering takes place during engaging.

18. The method of claim 15, wherein:
dipping comprises dipping at least a portion of the bump, wherein the bump defines a first surface area engaging the substrate; and
separating defines a generally planar second surface area joined with the bump away from and over the first surface area, the first and second surface areas having different magnitudes.

19. The method of claim 18, wherein separating comprises defining the second surface area to have a magnitude less than a magnitude the first surface area.

20. The method of claim 18, wherein separating comprises forming the first and second surface areas to define generally parallel planes.

21. A method of preparing a series of flip chip bumps comprising:
dipping at least portions of a series of bumps formed over a substrate, each of the series having respective outwardly exposed entireties, into a volume of conductive flowable material, at least some of the flowable material remaining over the bumps; and
solidifying flowable material remaining over the bumps, the solidified conductive material having outermost surfaces the entireties of which are outwardly exposed over the respective bumps.

22. The method of claim 21, further comprising, after solidifying, dipping at least portions of the outermost surfaces into a second volume of conductive flowable material, at least some of the second flowable material remaining over the outermost surfaces.

23. The method of claim 22, further comprising, after dipping the outermost surface portions into the second conductive flowable material, solidifying second conductive flowable material remaining over individual outermost surfaces and having respective outermost surfaces, the entireties of which are outwardly exposed.

24. The method of claim 21, wherein dipping comprises dipping bump portions wherein the bumps define respective bump heights over the substrate and further comprising providing a volume of conductive flowable material over a respective surface of each respective bump portion and to a desired thickness relative thereto and wherein dipping further comprises dipping the bump portions into the conductive flowable material a distance less than the bump heights.

25. The method of claim 24, wherein dipping comprises dipping the portions wherein the distance is sufficient to engage at least some of the bumps with the surface over which the conductive flowable material is provided.

26. The method of claim 21, wherein dipping comprises dipping at least portions of bumps, wherein the respective bumps include respective base portions having outer surfaces proximate the substrate and flowable material remaining over the bumps is not disposed over at least some of the base portion outer surfaces.

27. The method of claim 26, wherein solidifying defines respective bump assemblies having width dimensions which are essentially no greater than individual width dimensions of respective associated bumps.

28. A method of preparing a series of flip chip bumps comprising:
dipping at least portions of conductive bumps formed over a substrate into a conductive flowable material, at least some of the conductive flowable material remaining over the bumps;
while flowable material remaining over the bumps is in a generally flowable state, engaging the flowable material with a generally planar surface;
rendering the flowable material into a generally non-flowable state; and
separating the substrate from the generally planar surface.

29. The method of claim 28, wherein engaging and rendering increases respective height dimensions of the bumps without increasing respective base dimensions of the bumps.

30. The method of claim 29, wherein engaging and rendering increases respective height dimensions of the bumps and provides substantially uniform bump heights over the substrate.

31. The method of claim 28, wherein
dipping comprises dipping bumps having respective first surface areas engaging the substrate; and
separating the substrate from the generally planar surface defines generally planar second surface areas joined with the respective bumps away from and over the respective first surface areas, magnitudes of the first and second surface areas being different.

32. The method of claim 31, wherein separating comprises separating the substrate from the generally planar surface to provide second surface areas having magnitudes that are less than magnitudes of associated first surface areas over which the second surface areas are joined.

33. The method of claim 31, wherein separating comprises separating the substrate from the generally planar surface to provide first and second surface areas defining respective planes at least some of which are parallel with one another.

34. A method of interconnecting a pair of substrates comprising:
dipping at least a portion of a bump into a volume of conductive flowable material, at least some of the flowable material remaining over the bump with an entirety of the bump being outwardly exposed;
solidifying conductive flowable material remaining over the bump, the solidified conductive material having an entirely exposed outermost surface; and
conductively bonding the substrate with a second substrate through the solidified conductive material.

35. The method of claim 34, further comprising:
after solidifying the flowable conductive material, dipping at least a portion of the outermost surface into a volume of second conductive flowable material, at least some of the second conductive flowable material remaining over the outermost surface; and
after dipping the outermost surface portion into the second conductive flowable material, solidifying second conductive flowable material remaining over the outermost surface to provide an entirely exposed outermost surface.

36. The method of claim 34, further comprising:
after solidifying the conductive material, dipping at least a portion of the outermost surface into a volume of second conductive flowable material, wherein conductively bonding comprises engaging the substrate with the second substrate while at least some second conductive flowable material remains in a flowable state.

37. The method of claim 34, wherein:
dipping comprises dipping the bump portion wherein the bump comprises a base portion defining a width dimension proximate the substrate and an uppermost surface portion defining a bump height; and
solidifying defines a height greater than the height defined by the uppermost surface portion without increasing the width dimension defined by the base portion.

38. A method of interconnecting a pair of substrates comprising:
immersing at least a portion of a bump formed over a first substrate in a flowable epoxy;
removing the bump from the flowable epoxy;
substantially curing flowable epoxy remaining over the bump and forming a bump assembly; and
bonding the bump assembly with a second substrate.

39. The method of claim 38, wherein:
immersing comprises immersing the bump wherein the bump defines a bump height over the first substrate; and
providing the bump assembly defines a bump assembly height greater than a bump height.

40. The method of claim 38, further comprising, prior to bonding:
immersing at least a portion of the bump assembly in a second flowable epoxy; and
substantially curing the second flowable epoxy over the bump assembly.

41. The method of claim 38, wherein curing defines a generally planar bump assembly surface outwardly of the first substrate.

42. The method of claim 38, wherein curing comprises curing the epoxy against a generally planar surface.

43. The method of claim 38, wherein immersing comprises immersing the bump portion to form the bump assembly wherein the bump assembly has an outer surface comprising at least a portion of the material of the bump.

44. A method of interconnecting a pair of substrates comprising:
dipping at least a portion of a height of a conductive bump into a volume of conductive flowable material, the bump being disposed on a first substrate, at least some of the conductive flowable material remaining over the bump;
solidifying conductive flowable material remaining over the bump and forming a bump assembly comprising the bump and solidified conductive material, the solidified conductive material defining a bump assembly outermost surface the entirety of which is outwardly exposed, the outermost surface defining a bump assembly height greater than the bump height; and
bonding the bump assembly with a second substrate.

45. The method of claim 44, wherein dipping comprises coating only a portion of the bump wherein some of the bump assembly outermost surface comprises bump material.

46. The method of claim 45, wherein dipping comprises coating the portion of the bump assembly outermost surface and not coating a base portion of the bump proximate the first substrate.

47. The method of claim 44, further comprising:
engaging the flowable material remaining over the bump with a generally planar surface while flowable material remaining over the bump is in a flowable state;

rendering the flowable material into a generally non-flowable state; and separating the bump from the generally planar surface to provide a generally planar bump assembly uppermost surface.

48. A method of preparing a series of flip chip bumps comprising:

dipping at least portions of a plurality of conductive bumps into a conductive flowable material, individual ones of the plurality of conductive bumps being formed to have one of at least two different heights over a substrate;

while flowable material remaining over the bumps is in a generally flowable state, engaging the flowable material with a generally planar surface;

rendering the flowable material into a generally non-flowable state; and separating the substrate from the generally planar surface to provide a plurality of bump assemblies having a common height.

49. The method of claim 48, wherein engaging and rendering increases respective height dimensions of the bumps without increasing respective base dimensions of the bumps.

50. The method of claim 48, wherein:

dipping comprises dipping bumps having respective first surface areas engaging the substrate and separating defines generally planar second surface areas joined with the respective bumps away from and over the respective first surface areas, magnitudes of the first and second surface areas being different.

51. The method of claim 50, wherein separating comprises providing second surface areas having magnitudes less than magnitudes of associated first surface areas over which the second surface areas are joined.

52. The method of claim 50, wherein separating comprises providing first and second surface areas defining respective planes at least some of which are parallel with one another.

* * * * *